(12) United States Patent
Kim et al.

(10) Patent No.: US 6,878,605 B2
(45) Date of Patent: Apr. 12, 2005

(54) METHODS FOR MANUFACTURING SOI SUBSTRATE USING WAFER BONDING AND COMPLEMENTARY HIGH VOLTAGE BIPOLAR TRANSISTOR USING THE SOI SUBSTRATE

(75) Inventors: Jong-hwan Kim, Goyang (KR); Gi-ho Cha, Seoul (KR); Mun-heui Choi, Seoul (KR); Chang-beom Jeong, Bucheon (KR)

(73) Assignee: Fairchild Korea Semiconductor Ltd (KR)

( * ) Notice: Subject to any disclaimer, the term of this patent is extended or adjusted under 35 U.S.C. 154(b) by 0 days.

(21) Appl. No.: 10/441,527

(22) Filed: May 19, 2003

(65) Prior Publication Data
US 2004/0023443 A1 Feb. 5, 2004

(30) Foreign Application Priority Data
May 28, 2002 (KR) ........................ 2002-29604

(51) Int. Cl.[7] .............................. H01L 21/76
(52) U.S. Cl. .................. 438/424; 438/406; 438/430; 438/359; 438/361
(58) Field of Search .................. 438/313, 322–325, 438/353–359, 361, 404–406, 414, 424, 430, 479

(56) References Cited

U.S. PATENT DOCUMENTS

| | | | | |
|---|---|---|---|---|
| 3,508,980 A | * | 4/1970 | Boland et al. | 438/406 |
| 4,393,573 A | * | 7/1983 | Kato et al. | 438/322 |
| 4,570,330 A | * | 2/1986 | Cogan | 438/413 |
| 4,851,366 A | * | 7/1989 | Blanchard | 438/405 |
| 5,091,330 A | * | 2/1992 | Cambou et al. | 438/406 |
| 5,204,282 A | * | 4/1993 | Tsuruta et al. | 438/406 |
| 5,268,326 A | * | 12/1993 | Lesk et al. | 438/406 |
| 5,619,054 A | * | 4/1997 | Hashimoto | 257/347 |
| 5,650,354 A | * | 7/1997 | Himi et al. | 438/152 |
| 6,140,170 A | * | 10/2000 | Shibib | 438/203 |
| 6,214,702 B1 | * | 4/2001 | Kim | 438/459 |
| 6,472,254 B2 | * | 10/2002 | Cantarini et al. | 438/138 |
| 6,528,379 B2 | * | 3/2003 | Takada et al. | 438/322 |

* cited by examiner

Primary Examiner—Amir Zarabian
Assistant Examiner—Khanh Duong
(74) Attorney, Agent, or Firm—Kenneth E. Horton; Kirton & McConkie

(57) ABSTRACT

A method of manufacturing an SOI substrate for semiconductor devices is described. The method includes forming a low density impurity region in a first semiconductor substrate and a high density impurity region in the low density impurity region, forming a trench surrounding the low density impurity region and the high density impurity region, the depth of the trench being deeper than the high density impurity region and shallower than the low density impurity region, forming an insulating layer on the surface of the first semiconductor substrate to fill the inside of the trench, attaching a second semiconductor substrate on the surface of the insulating layer, and removing a part of the first semiconductor substrate so that the bottom of the trench is exposed.

24 Claims, 6 Drawing Sheets

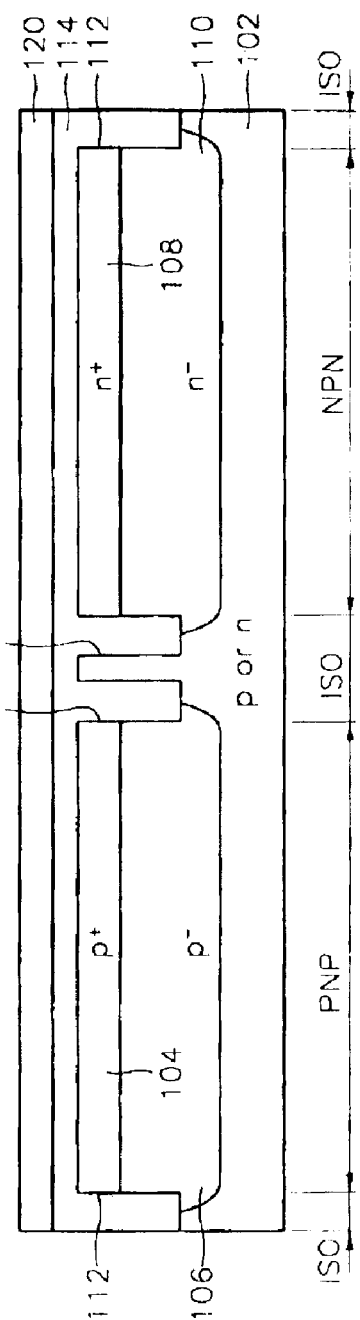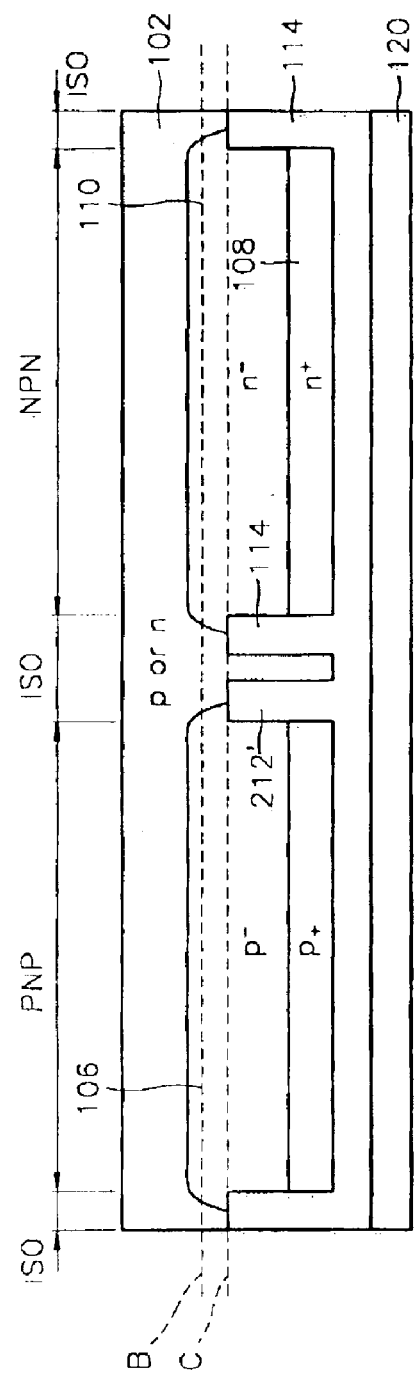

US 6,878,605 B2

METHODS FOR MANUFACTURING SOI SUBSTRATE USING WAFER BONDING AND COMPLEMENTARY HIGH VOLTAGE BIPOLAR TRANSISTOR USING THE SOI SUBSTRATE

REFERENCE TO RELATED APPLICATION

This application claims priority to Korean Patent Application No. 2002-29604, filed 28 May 2002, the disclosure of which is incorporated herein by reference.

FIELD OF THE INVENTION

The invention generally relates to methods for fabricating integrated circuits (ICs) and semiconductor devices and the resulting structures. More particularly, the invention relates generally to methods for manufacturing a silicon on insulator (SOI) substrate using wafer bonding and semiconductor devices containing the same, such as a complementary high voltage bipolar transistor using the SOI substrate.

BACKGROUND OF THE INVENTION

Integrated circuits (ICs) are typically formed using a silicon substrate. The ICs often include a series of active devices that are electrically connected to one another and are manufactured in or on the substrate. Each active device is typically formed by changing the conductivity of a particular region of the substrate, i.e., by implanting or diffusing impurities into the substrate.

One of these active devices, the complementary high voltage bipolar transistor (BT), has been adapted to be used in ICs requiring high performance and speedy amplification. If a complementary high voltage BT is formed on an SOI substrate to improve the electric characteristics and prevent latch-ups due to a parasitic transistor, a number of can problems occur. For example, a SOI substrate often contains an epitaxial layer on which the complementary high voltage BT is formed, which can contribute to defects of the devices. In particular, one of the defects is that the breakdown voltage (which is greatly influenced by the thickness of the epitaxial layer) can not be easily controlled.

Other problems exist for complementary high voltage BTs formed on SOI substrates. In particular, a pnp bipolar transistor (which determines electric characteristics of the device depending on relatively low hole movements) can increase the breakdown voltage in a collector region due to an over diffusion in the P+ type buried layer used as the current path for a collector in the BT.

SUMMARY OF THE INVENTION

It is an object of the invention to provide a method for manufacturing an SOI substrate where the breakdown voltage is easily controlled without using an epitaxial layer. It is another object of the invention to provide a method for manufacturing a complementary bipolar transistor using this SOI substrate.

To achieve these objects, the invention provides a method for manufacturing an SOI substrate by: forming a low density impurities region in a first semiconductor substrate and a high density impurities region in the low density impurities region; forming a trench surrounding the low density impurities region and the high density impurities region, where the depth of the trench is deeper than the high density impurities region and shallower than the low density impurities region; forming an insulating layer on the front surface of the first semiconductor substrate to fill the inside of the trench; attaching a second semiconductor substrate on the surface of the insulating layer; and then removing a part of the first semiconductor substrate so that the bottom of the trench is exposed.

In one aspect of the invention, the method for manufacturing the SOI substrate can further comprise the process of planarizing the insulating layer after forming the insulating layer. The process of planarizing can be performed by a chemical mechanical polishing (CMP) step.

In one aspect of the invention, the process for removing a part of the first semiconductor substrate can comprise a first process for removing the first semiconductor substrate so that the low density impurities region is exposed, and a second process for removing a part of the first semiconductor substrate so that the first insulating layer is exposed. The first process and the second process can be performed using a CMP step.

To achieve these objects, the invention also includes a method for manufacturing an SOI substrate by: forming a low density impurities region in a first semiconductor substrate and a high density impurities region in the low density impurities region; forming a first trench surrounding the low density impurities region and the high density impurities region, where the depth of the trench being is than the high density impurities region and shallower than the low density impurities region; forming a second trench having a narrower width than that of the first trench in the first trench by forming a first insulating layer on the front surface of the first semiconductor substrate on which the first trench is formed; forming a polycrystalline silicon layer for filling the inside of the second trench on the first insulating layer; forming a second insulating layer on the polycrystalline silicon layer; attaching the second semiconductor substrate on the second insulating layer; and then removing a part of the first semiconductor substrate so that the first insulating layer on the bottom of the trench is exposed. The first insulating layer can be a thermal oxide layer. The second insulating layer is a BPSG layer.

In one aspect of the invention, the method for manufacturing the SOI substrate may further comprise a process of planarizing the upper surface of the polycrystalline silicon layer after forming the polycrystalline layer. The process of planarizing can be performed using a CMP step.

In one aspect of the invention, removing a part of the first semiconductor substrate can comprise a first process of removing the first semiconductor substrate so that the low density impurities region is exposed, and a second process of removing a part of the first semiconductor substrate so that the first insulating layer is exposed. The first process and the second process can be performed using a CMP step.

To achieve these objects, the invention further includes a method for manufacturing a complementary bipolar transistor using an SOI substrate by: preparing a first semiconductor substrate having a first region and a second region; forming a first conductive low density impurities region in the first region of the first semiconductor substrate and a first conductive high density impurities region in the low density impurities region; forming a second conductive low density impurities region in a second region of the first semiconductor substrate and a second conductive high density impurities region in the low density impurities region; forming a trench between the first region and the second region, where the depth of the trench is deeper than the high density impurities region and shallower than the low density impurities region; forming an insulating layer on the front surface of the first semiconductor substrate in order to fill the inside of the trench; attaching a second semiconductor substrate on the surface of the insulating layer; removing a part of the first semiconductor substrate so that the insulating layer on the bottom of the trench is exposed; and forming a first bipolar transistor in the first region and a second bipolar transistor in the second region. In one aspect of the invention, the first conductive type can be a p type, the second conductive type can be an n type, the first bipolar transistor can be a pnp bipolar transistor, and the second bipolar transistor can be an npn bipolar transistor.

BRIEF DESCRIPTION OF THE DRAWINGS

The above object and advantages of the invention will become more apparent by describing in detail preferred aspects thereof with reference to the attached drawings, in which:

FIGS. 1 through 5 depict cross-sectional views of a method for manufacturing an SOI substrate according to one aspect of the invention;

FIGS. 1–11 illustrate specific aspects of the invention and are a part of the specification. Together with the following description, these Figures demonstrate and explain the principles of the invention.

DETAILED DESCRIPTION OF THE INVENTION

The following description provides specific details in order to provide a thorough understanding of the invention. The skilled artisan, however, would understand that the invention can be practiced without employing these specific details. Indeed, the invention can be practiced by modifying the illustrated method and resulting product and can be used in conjunction with apparatus and techniques conventionally used in the industry.

Figure 1:
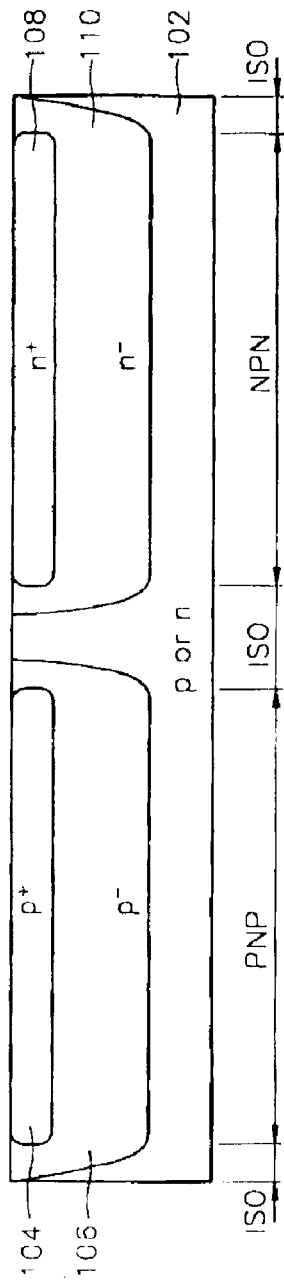

FIGS. 1 through 5 are cross-sectional views showing a method for manufacturing an SOI substrate according to one aspect of the invention. As shown in FIG. 1, a silicon substrate 102 having a pnp bipolar transistor region (PNP) and an npn bipolar transistor (NPN) is prepared as known in the art. The pnp bipolar transistor region (PNP) and the npn bipolar transistor (NPN) are separated by an isolation region (ISO). The silicon substrate 102 can be formed of a first conductive type, such as a p-type, or a second conductive type, such as an n-type.

In the pnp bipolar transistor region (PNP), a $p^+$ buried layer 104 and a $p^-$ well region 106 surrounding the $p^+$ buried layer 104 are first formed on the silicon substrate 102. Then the $p^+$ buried layer 104 and $p^-$ well region 106 are formed by an ion implantation process and a diffusion process using a mask layer pattern (not shown) for a first ion implantation. The mask layer pattern (not shown) for the first ion implantation has an opening for exposing the surface of a silicon substrate 102 where the $p^+$ buried layer 104 and the $p^-$ well region 106 will be formed. In one aspect of the invention, the diffusion process can be separated into two diffusion processes: forming the $p^+$ buried layer 104 in a relatively short time and forming the $p^-$ well region 106 in a relatively long time.

Next, in the npn bipolar transistor region (NPN), an $n^+$ buried layer 108 and an $n^-$ well region 110 surrounding the $n^+$ buried layer 108 are formed on the silicon substrate 102. The $n^+$ buried layer 108 and the $n-$ well region 110 are formed by an ion implantation process and a diffusion process using a mask layer pattern (not shown) for a second ion implantation. The mask layer pattern (not shown) for the second ion implantation has an opening for exposing the surface of a silicon substrate 102 where the $n^+$ buried layer 108 and the $n^-$ well region 110 will be formed. In one aspect of the invention, this diffusion process can include two diffusion processes: forming the $n^+$ buried layer 108 in a relatively short time and forming the $n^-$ well region 110 in a relatively long time. In one aspect of the invention, the $n^+$ buried layer 108 and the $n^-$ well region 100 can be formed first.

Figure 2:
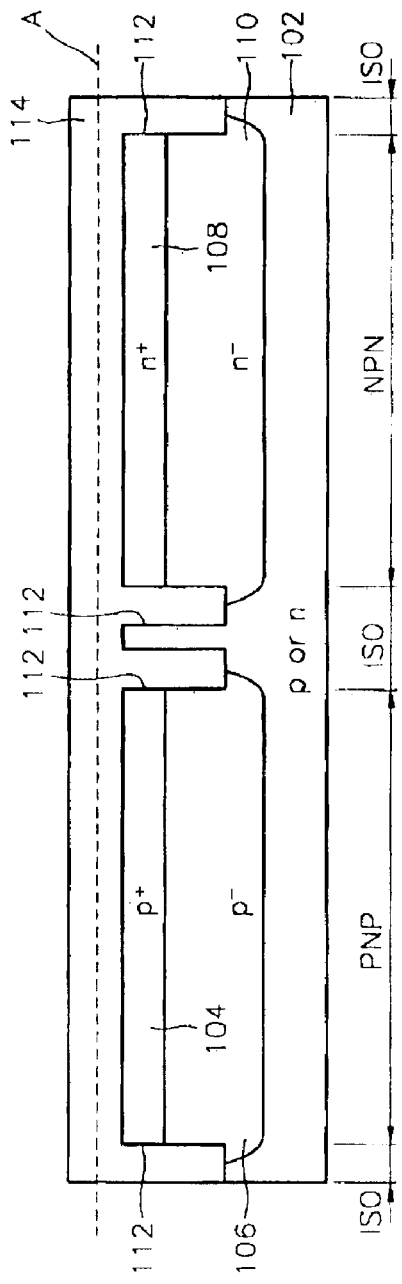

Next, as depicted in FIG. 2, a mask layer pattern (not shown) that will be used in forming a trench 112 that covers a pnp bipolar transistor PNP and npn bipolar transistor NPN is formed. Then a trench 112 is formed by etching an exposed portion of the silicon substrate 102 using the mask layer pattern as an etching mask. The trench 112 is formed to be deeper than the ends of the $p^+$ buried layer 104 and the $n^+$ buried layer 108 and thinner than the ends of the $p-$ well region 106 and $n^-$ buried layer 110. Next, an insulating layer 114 is formed on the front (or upper) surface of the silicon substrate 102 containing the trench 112. The insulating layer 114 can be formed to have any thickness on the surface of the semiconductor substrate 102 that fills in the inside of the trench 112. After the insulating layer 114 has been formed, a surface of the insulating layer 114 (namely the surface for attaching another wafer as described below) is softened by performing a planarization process. The planarization process can be performed by a chemical mechanical polishing (CMP) until the portion indicated by dotted line "A" is reached. Next, as shown in FIG. 3, a handling wafer 120 is attached on the surface of the planarized insulating layer 114.

Figure 5:
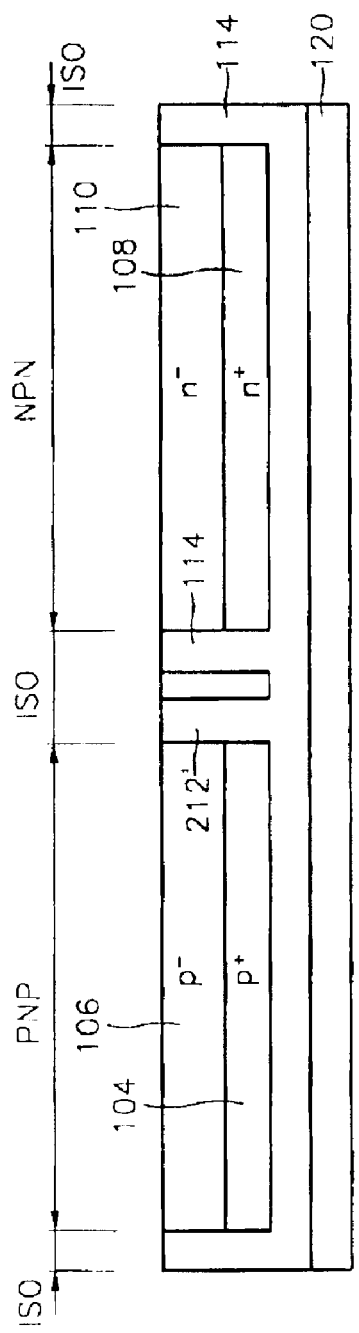

Next, as shown in FIG. 4, the silicon substrate 102 is rotated (or flipped) 180 degrees so that the silicon substrate 102 is positioned "upward" and the handling wafer 120 is positioned "downward." Next, a planarization process can be performed by a CMP process until the level B is reached, exposing the $p^-$ well region 106 and the $n^-$ well region 110. Then, the planarization process for removing the semiconductor substrate 102 is performed again until the level C is reached, exposing the insulating layer 114. The planarization process can be performed by using the insulating layer 114 as an etch stop. With the insulating layer 114 exposed, it can be used as an align key in any subsequent photolithography processing. The resulting SOI substrate that is formed after the planarization process (with the surface of the insulating layer 114 exposed) is shown in FIG. 5.

Figure 6:
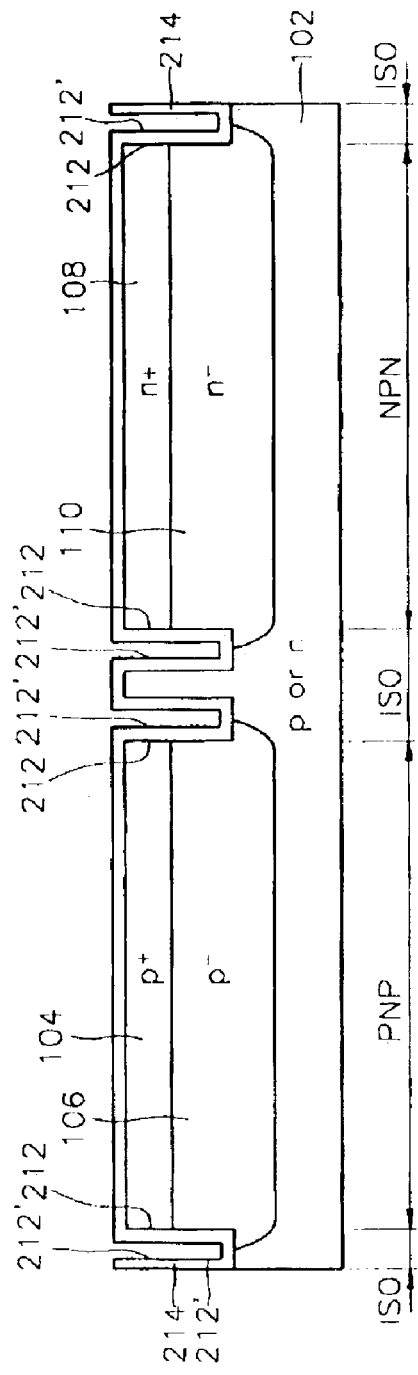
FIGS. 6 through 10 illustrate cross-sectional views of a method for manufacturing an SOI substrate according to another aspect of the invention.

FIGS. 6 through 10 are cross-sectional views showing a method for manufacturing an SOI substrate according to another aspect of the invention. As depicted in FIG. 6, a mask layer pattern (not shown) that will be used in forming a trench that covers a pnp bipolar transistor region PNP and an npn bipolar transistor region NPN is formed in a manner similar to the process described with reference to FIG. 1. Then, a first trench 212 can be formed by etching an exposed portion of the silicon substrate 102 using the mask layer pattern as an etching mask. The first trench 212 is formed to be deeper than the bottom of the $p^+$ buried layer 104 and the $n^+$ buried layer 108, and shallower than the bottom of the $p^-$ well region 106 and the $n^-$ buried layer 110. Then a first insulating layer 214 (made of, for example, a thermal oxide)

is formed on the front (or upper) surface of the silicon substrate 102 containing the first trench 212. The first insulating layer 214 is also formed on the inner surface of the first trench 212, but does not fill the inside of the first trench 212 completely. As a result, a second trench 212' having a narrower width than the width of the first trench 212 is formed.

Figure 7:
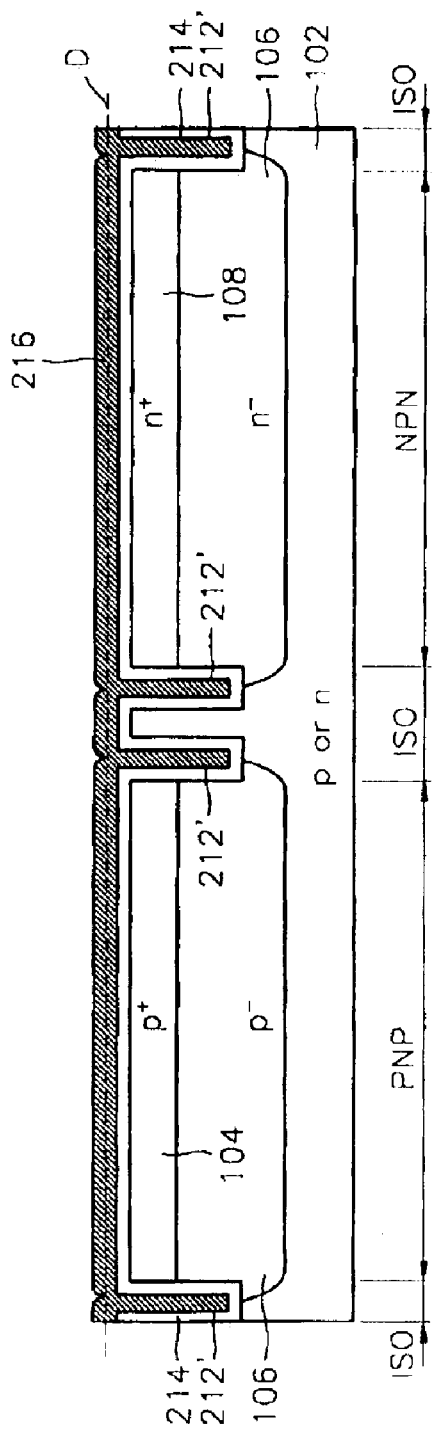

As depicted in FIG. 7, a polycrystalline silicon layer 216 is then formed on the front surface of the silicon substrate 102 that contains the first insulating layer 214. The polycrystalline silicon layer 216 is formed to completely fill the inside of the second trench 212'. Next, the surface of the polycrystalline silicon layer 216 is softened by performing a planarization process. The planarization process can be performed using a CMP process until the dotted line D is reached.

Figure 8:
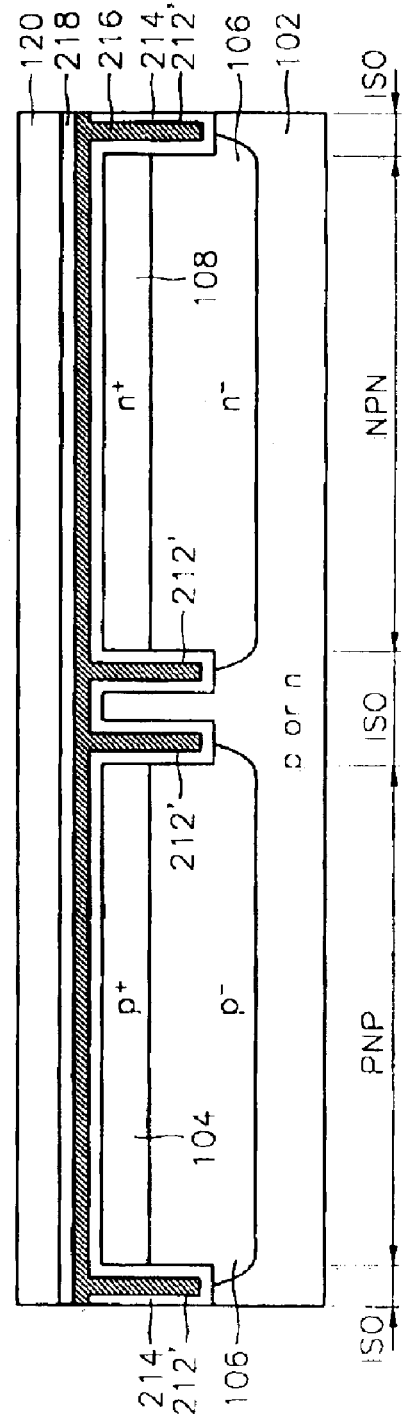

As illustrated in FIG. 8, a second insulating layer 218 (made of, for example, a borophosphorsilicate glass (BPSG)) is formed on the planarized polycrystalline silicon layer 216. The second insulating layer 218 is then reflowed by performing a thermal heating process at about 1000° C. Then a wafer attaching process is performed to attach a handling wafer 120 to the second insulating layer 218.

Figure 9:
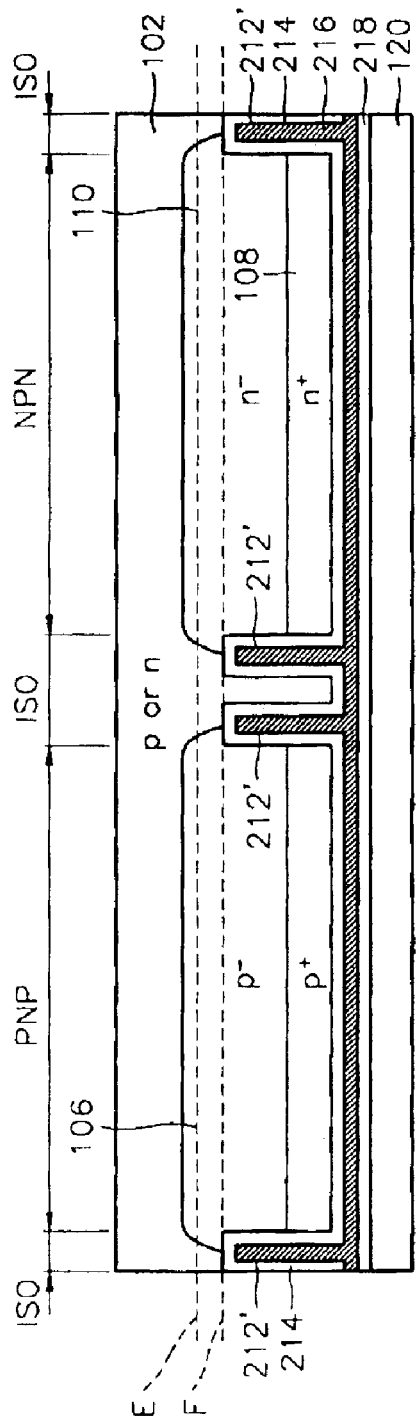
Figure 10:
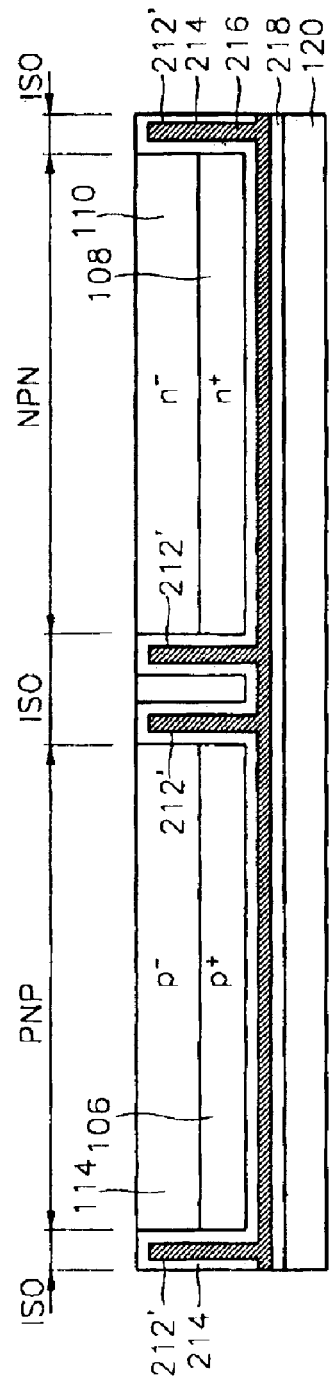

As shown in FIG. 9, the silicon substrate 102 is then rotated (or flipped) by 180 degrees so that the silicon substrate 102 is positioned "upward" and the attached handling wafer 120 is positioned "downward." Next, a planarization process using a CMP is performed until the level E is reached, thereby exposing the p– well region 106 and the n– well region 110. Then the planarization process for removing the semiconductor substrate 102 is performed again until the level F is reached, thereby exposing the insulating layer 214. Thus, the planarization process can be performed using the insulating layer 214 as an etch stop. When exposed, the insulating layer 214 can be used as an alignment key in subsequent photolithography processing. The resulting SOI substrate that is formed after the planarization process (which exposes the surface of the insulating layer 214) is shown in FIG. 10.

Figure 11:
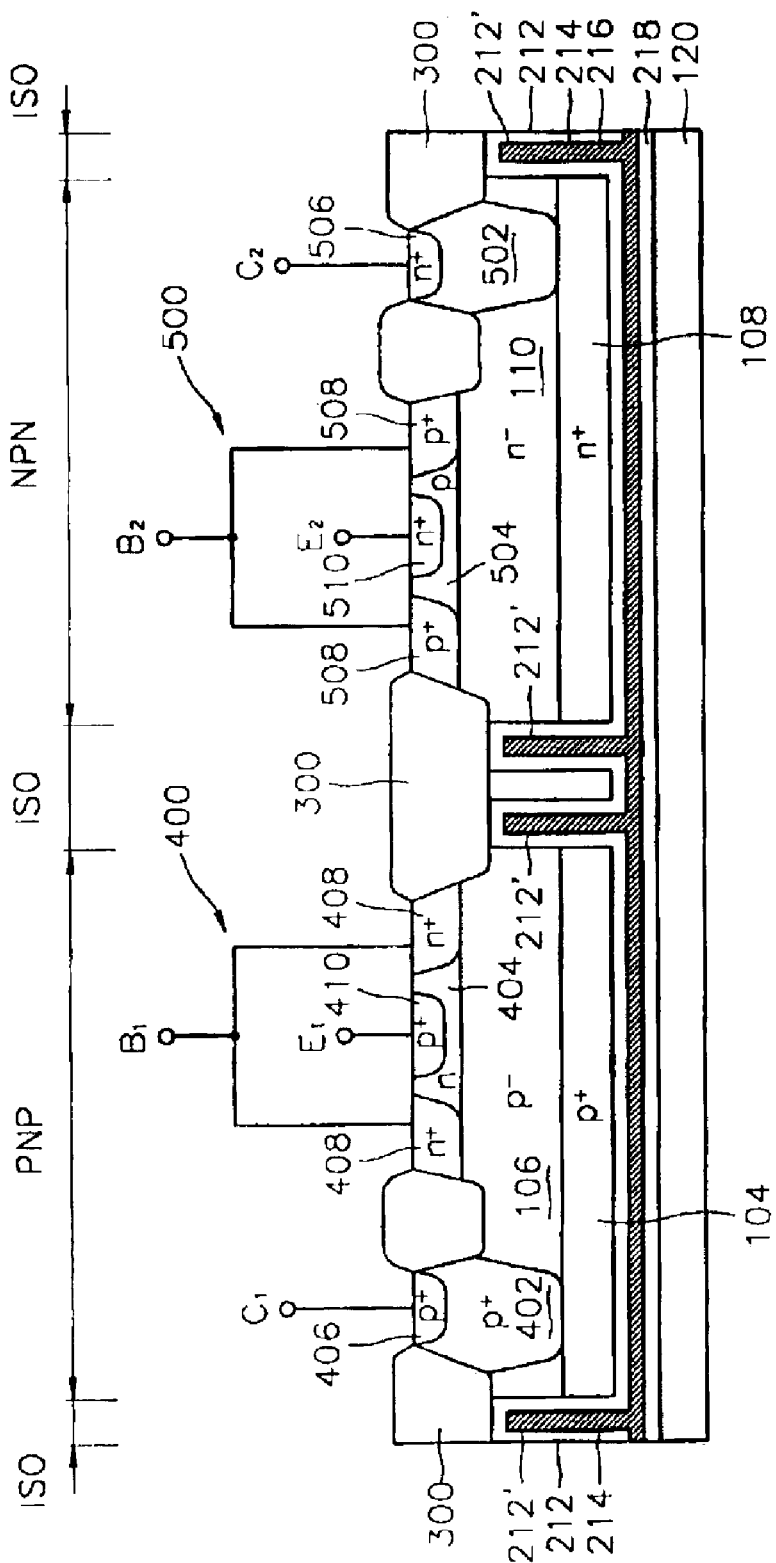
FIG. 11 shows a cross-sectional view of a complementary bipolar transistor formed on an SOI substrate manufactured by the method according to one aspect of the invention.

FIG. 11 depicts a complementary bipolar transistor formed on an SOI substrate that has been manufactured according to method of the invention. Referring to FIG. 11, a vertical pnp bipolar transistor 400 is formed in a pnp bipolar transistor region PNP and a vertical npn bipolar transistor 500 is formed in an npn bipolar transistor region NPN are separated by an isolation region ISO. In the isolation region ISO, a trench 212 is filled with the thermal oxide layer 214 and the polycrystalline silicon layer 216. The device in FIG. 11 also contains LOCOS local oxidation of silicon oxide layer 300. The pnp bipolar transistor 400 is insulated from the handling substrate 120 by the thermal oxide layer 214 under the p+ buried layer 104, the polycrystalline silicon layer 216, and the BPSG layer 218. The npn bipolar transistor 500 is insulated from the handling substrate 120 by the thermal oxide layer 214 under the n+ buried layer 108, the polycrystalline silicon layer 216, and the BPSG layer 218 in substantially the same manner.

The pnp bipolar transistor 400 contains a p+ sink region 402 contacting the p+ buried layer 104 and an n body region 404 formed on the p– well region 106 that is isolated from the p+ sink region 402. The p+ collector region 406 is formed on the p+ sink region 402. The n+ base region 408 and the p+ emitter region 410 are formed on the n body region 404. A collector electrode $C_1$, a base electrode $B_1$, and an emitter electrode $E_1$ are formed to electrically connect to the p+ collector region 406, the n+ base region 408, and the p+ emitter region 410, respectively.

The npn bipolar transistor 500 also contains an n+ sink region 502 contacting the n+ buried layer 104 and a p body region 504 formed on the n– well region 106 that is isolated from the n+ sink region 502. The n+ collector region 506 is formed on the p+ sink region 502. The p+ base region 508 and the n+ emitter region 510 are formed on the p body region 504. A collector electrode $C_2$, a base electrode $B_2$, and an emitter electrode $E_2$ are formed to electrically connect to the n+ collector region 506, the p+ base region 508, and the n+ emitter region 510, respectively.

As described above, the invention includes methods for manufacturing an SOI substrate and a device (i.e., complementary bipolar transistor) containing the SOI substrate. Using the invention, a semiconductor device can be manufactured not on an epitaxial layer but on the active wafer. Therefore, it is possible to manufacture a semiconductor device with few defects. In addition, the invention provides an advantage in controlling the break down voltage of a semiconductor device because the break down voltage can be controlled using to the height of a trench. The p+ buried layer in the devices of the invention is not overly diffused and, therefore, there is no worry regarding the increase in the breakdown voltage.

While the present invention has been particularly shown and described with reference to preferred aspects thereof, it will be understood by those skilled in the art that various changes in form and details may be made therein without departing from the spirit and scope of the invention as defined by the appended claims. For example, an SOI substrate according to the invention has been described to be employed in a complementary bipolar transistor including a vertical pnp bipolar transistor and a vertical npn bipolar transistor. The SOI substrate can be used in other semiconductor devices, i.e., in a complementary morse transistor instead of a complementary bipolar transistor.

We claim:

1. A method for manufacturing an SOI substrate comprising:

forming a low density impurities region in a first semiconductor substrate and a high density impurities region in the low density impurities region;

forming a trench surrounding the low density impurities region and the high density impurities region, the depth of the trench being deeper than the high density impurities region and shallower than the low density impurities region;

forming an insulating layer on the front surface of the first semiconductor substrate to fill the inside of the trench;

planarizing the insulating layer;

attaching a second semiconductor substrate on the surface of the insulating layer; and removing a part of the first semiconductor substrate so that the bottom of the trench is exposed.

2. The method for manufacturing an SOI substrate of claim 1, wherein the process of planarizing is performed by a chemical mechanical polishing.

3. The method for manufacturing an SOI substrate of claim 1, wherein the process for removing a part of the first semiconductor substrate comprises:

a first process for removing the first semiconductor substrate so that the low density impurities region is exposed; and a second process for removing a part of the first semiconductor substrate so that the first insulating layer is exposed.

4. The method for manufacturing an SOI substrate of claim 3, wherein the first process and the second process are performed using a chemical mechanical polishing.

5. A method for manufacturing an SOI substrate comprising:
   forming a low density impurities region in a first semiconductor substrate and a high density impurities region in the low density impurities region;
   forming a first trench surrounding the low density impurities region and the high density impurities region, the depth of the trench being deeper than the high density impurities region and shallower than the low density impurities region;
   forming a second trench having a narrower width than that of the first trench in the first trench by forming a first insulating layer on the front surface of the first semiconductor substrate on which the first trench is formed;
   forming a polycrystalline silicon layer for filling the inside of the second trench, on the first insulating layer;
   forming a second insulating layer on the polycrystalline silicon layer;
   attaching a second semiconductor substrate on the second insulating layer; and
   removing a part of the first semiconductor substrate so that the first insulating layer on the bottom of the trench is exposed.

6. The method for manufacturing an SOI substrate of claim 5, wherein the first insulating layer is a thermal oxide layer.

7. The method for manufacturing an SOI substrate of claim 5, comprising a process of planarizing the upper surface of the polycrystalline silicon layer after forming the polycrystalline layer.

8. The method for manufacturing an SOI substrate of claim 7, wherein the process of planarizing is performed by a chemical mechanical polishing.

9. The method for manufacturing an SOI substrate of claim 5, wherein the second insulating layer is a BPSG layer.

10. The method for manufacturing an SOI substrate of claim 5, wherein the act of removing a part of the first semiconductor substrate comprises:
    a first process of removing the first semiconductor substrate so that the low density impurities region is exposed; and
    a second process of removing a part of the first semiconductor substrate so that the first insulating layer is exposed.

11. The method for manufacturing an SOI substrate of claim 10, wherein the first process and the second process are performed using a chemical mechanical polishing.

12. A method for manufacturing a complementary bipolar transistor using an SOI substrate, the method comprising:
    preparing a first semiconductor substrate having a first region and a second region;
    forming a first conductive low density impurities region in the first region of the first semiconductor substrate and a first conductive high density impurities region in the low density impurities region;
    forming a second conductive low density impurities region in a second region of the first semiconductor substrate and a second conductive high density impurities region in the low density impurities region;
    forming a trench between the first region and the second region, the depth of the trench being deeper than the high density impurities region and shallower than the low density impurities region;
    forming an insulating layer on the front surface of the first semiconductor substrate in order to fill the inside of the trench;
    planarizing the insulating layer;
    attaching a second semiconductor substrate on the surface of the insulating layer;
    removing a part of the first semiconductor substrate so that the insulating layer on the bottom of the trench is exposed; and
    forming a first bipolar transistor in the first region and a second bipolar transistor in the second region.

13. The method for manufacturing a complementary bipolar transistor of claim 12, wherein the first conductive type is a p type, the second conductive type is an n type, the first bipolar transistor is a pnp bipolar transistor, and the second bipolar transistor is an npn bipolar transistor.

14. A method for manufacturing an SOI structure, comprising:
    providing a first substrate with a lightly doped impurity region containing a highly doped impurity region therein;
    forming a trench in the substrate, wherein the depth of the trench is deeper than the highly doped impurity region and shallower than the lightly doped impurity region;
    providing an insulating layer on an upper surface of the first substrate containing the trench;
    planarizing the insulating layer;
    providing a second substrate on the insulating layer; and
    removing a portion of the first substrate sufficient to expose the trench.

15. The method of claim 14, wherein the removing process comprises:
    a first process for removing enough of the first substrate to expose lightly doped impurity region; and
    a second process for removing enough of the first substrate to expose the insulating layer.

16. A method for manufacturing an SOI structure, comprising:
    providing a first substrate with a lightly doped impurity region containing a highly doped impurity region therein;
    forming a trench in the substrate, wherein the depth of the trench is deeper than the highly doped impurity region and shallower than the lightly doped impurity region;
    forming a second trench in the first trench by forming a first insulating layer on the surface of the first substrate containing the first trench;
    forming a polycrystalline silicon layer to fill the second trench;
    forming a second insulating layer on the polycrystalline silicon layer;
    providing a second substrate on the second insulating layer; and
    removing a portion of the first substrate to expose the first insulating layer.

17. The method of claim 16, further comprising planarizing the polycrystalline layer.

18. The method of claim 16, wherein the second insulating layer comprises BPSG.

19. The method of claim 16, wherein the removing process comprises: a a first process for removing enough of the first substrate to expose lightly doped impurity region; and a second process for removing enough of the first substrate to expose the first insulating layer is exposed.

20. A method for making a semiconductor device, comprising:

providing a first substrate with a lightly doped impurity region containing a highly doped impurity region therein;

forming a trench in the substrate, wherein the depth of the trench is deeper than the highly doped impurity region and shallower than the lightly doped impurity region;

providing an insulating layer on an upper surface of the first substrate containing the trench;

planarizing the insulating layer;

providing a second substrate on the insulating layer; and removing a portion of the first substrate sufficient to expose the trench.

21. A method for making a semiconductor device, comprising:

providing a first substrate with a lightly doped impurity region containing a highly doped impurity region therein;

forming a trench in the substrate, wherein the depth of the trench is deeper than the highly doped impurity region and shallower than the lightly doped impurity region;

forming a second trench in the first trench by forming a first insulating layer on the surface of the first substrate containing the first trench;

forming a polycrystalline silicon layer to fill the second trench;

forming a second insulating layer on the polycrystalline silicon layer;

providing a second substrate on the second insulating layer; and removing a portion of the first substrate to expose the first insulating layer.

22. A method for manufacturing a semiconductor device using an SOI substrate, the method comprising:

providing a first substrate having a first region and a second region;

forming a first conductivity type dopant region in the first region, the first conductivity type dopant region containing a region with a higher dopant concentration;

forming a second conductivity type dopant region in the second region, the second conductivity type dopant region containing a region with a higher dopant concentration;

forming a trench between the first region and the second region;

forming an insulating layer on the surface of the first substrate;

planarizing the insulating layer;

providing a second substrate on the surface of the insulating layer;

removing enough of the first substrate to expose the insulating layer; and forming a first bipolar transistor in the first region and a second bipolar transistor in the second region.

23. The method of claim 22, wherein the semiconductor device is a complementary bipolar transistor.

24. The method of claim 22, wherein the first conductivity type is a p type dopant, the second conductivity type is an n type dopant, the first bipolar transistor is a pnp bipolar transistor, and the second bipolar transistor is an npn bipolar transistor.

* * * * *